United States Patent
Pepe et al.

(10) Patent No.: US 7,658,651 B2
(45) Date of Patent: Feb. 9, 2010

(54) ELECTRICAL CONNECTORS AND CIRCUIT BOARDS HAVING NON-OHMIC PLATES

(75) Inventors: Paul John Pepe, Clemmons, NC (US); Shawn Phillip Tobey, Trinity, NC (US); Sheldon Easton Muir, Whitsett, NC (US); Steven Richard Bopp, Jamestown, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 57 days.

(21) Appl. No.: 12/109,544

(22) Filed: Apr. 25, 2008

(65) Prior Publication Data
US 2009/0269978 A1    Oct. 29, 2009

(51) Int. Cl.
*H01R 24/00* (2006.01)

(52) U.S. Cl. .................. 439/676; 439/620.22; 439/941; 174/261; 361/777

(58) Field of Classification Search .................. 439/676, 439/620.22, 941; 174/261; 361/777
See application file for complete search history.

(56) References Cited

U.S. PATENT DOCUMENTS

| | | | |
|---|---|---|---|
| 5,399,106 A | 3/1995 | Ferry | |
| 5,975,960 A | 11/1999 | Fogg et al. | |
| 6,069,980 A | 5/2000 | Honda | |
| 6,096,980 A * | 8/2000 | Ferry | 174/261 |
| 6,162,076 A | 12/2000 | Francaviglia | |
| 6,273,751 B1 | 8/2001 | Francaviglia | |
| 6,710,255 B2 | 3/2004 | Ross et al. | |
| 7,154,049 B2 | 12/2006 | Celella et al. | |
| 7,182,649 B2 | 2/2007 | Caveney et al. | |
| 7,402,085 B2 | 7/2008 | Hammond, Jr. et al. | |

OTHER PUBLICATIONS

International Search Report, International Application No. PCT/US2009/002370, International Filing Date, Apr. 16, 2009.

* cited by examiner

*Primary Examiner*—Tho D Ta

(57) ABSTRACT

An electrical connector includes a housing and a plurality of contacts within the housing that are configured to engage with mating contacts of a mating connector. The contacts form at least a first differential pair and a second differential pair. The electrical connector also includes a circuit board housed within the housing. The circuit board has a substrate body formed from a dielectric material and includes a first trace electrically coupled to a contact of the first differential pair and a second trace electrically coupled to a contact of the second differential pair. At least one of the first and second traces is an open-ended trace. The circuit board also has a non-ohmic plate that is positioned adjacent to the traces. The plate is positioned to electromagnetically couple the first and second traces to each other and the non-ohmic plate and traces are configured for a desired electrical performance.

20 Claims, 12 Drawing Sheets

US 7,658,651 B2

ELECTRICAL CONNECTORS AND CIRCUIT BOARDS HAVING NON-OHMIC PLATES

BACKGROUND OF THE INVENTION

The subject matter herein relates generally to electrical connectors, and more particularly, to electrical connectors that have circuit boards and that utilize differential pairs.

Electrical connectors are commonly used in telecommunication systems. The electrical connectors, such as modular jacks and modular plugs, may provide interfaces between successive runs of cable in such systems and between cables and electronic devices. The electrical connectors may include contacts that are arranged according to known industry standards, such as Electronics Industries Alliance/Telecommunications Industry Association ("EIA/TIA")-568. The electrical connectors have traditionally been used for data transmission, wherein the performance of the electrical connectors may be negatively affected by, for example, near-end crosstalk (NeXT) and/or return loss.

To compensate for the crosstalk and/or to improve the return loss, known techniques have focused on arranging the contacts within the housing of the electrical connector to provide desired effects. In one known electrical connector, non-ohmic traces have been added and positioned next to the contacts on a circuit board within the housing. A non-ohmic trace represents a trace that is not electrically connected to the contacts or to ground. The non-ohmic trace may be used to reduce the effects of crosstalk by promoting capacitative and/or inductive energy coupling between the non-ohmic trace and adjacent contacts. In the known art, the non-ohmic traces are located laterally along the sides of the contact, thereby forming edge-to-edge coupling with the contacts. However, the known electrical connector has not been able to effectively use the non-ohmic trace to improve performance and, in fact, the non-ohmic traces have afforded a limited effect on the electrical performance.

Thus, there is a need for alternative means to improve the electrical performance of the connector, such as by reducing crosstalk and/or improving return loss. In particular, there is a need to improve or maximize the effectiveness of a non-ohmic trace that is positioned adjacent to electrical contacts.

BRIEF DESCRIPTION OF THE INVENTION

In one embodiment, an electrical connector includes a housing and a plurality of contacts within the housing that are configured to engage with mating contacts of a mating connector. The contacts form at least a first differential pair and a second differential pair. The electrical connector also includes a circuit board housed within the housing. The circuit board has a substrate body formed from a dielectric material and includes a first trace electrically coupled to a contact of the first differential pair and a second trace electrically coupled to a contact of the second differential pair. At least one of the first and second traces is an open-ended trace. The circuit board also has a non-ohmic plate that is positioned adjacent to the traces. The plate is positioned to electromagnetically couple the first and second traces to each other and the non-ohmic plate and traces are configured for a desired electrical performance.

Optionally, the non-ohmic plate may be positioned within the substrate body. The non-ohmic plate may include a plate surface and the first and second traces may each have a trace surface. The non-ohmic plate may be positioned within the substrate body such that the plate surface faces and extends parallel to the trace surfaces. Also, the first and second traces may each have an outer edge surface that extends lengthwise along the substrate body and the non-ohmic plate may have two opposing outer edge surfaces that extend lengthwise within the substrate body. At least one of the outer edge surfaces of the first and second traces may be substantially aligned with at least one of the outer edge surfaces of the non-ohmic plate.

In another embodiment, a circuit board that is configured to be electrically connected to a plurality of contacts that form a plurality of differential pairs is provided. The circuit board includes a substrate body formed from a dielectric material and includes a first trace electrically coupled to a contact of the first differential pair and a second trace electrically coupled to a contact of the second differential pair. At least one of the first and second traces is an open-ended trace. The circuit board also has a non-ohmic plate that is positioned adjacent to the traces. The plate is positioned to electromagnetically couple the first and second traces to each other and the non-ohmic plate and traces are configured for a desired electrical performance.

Optionally, the first and second traces may be co-planar. The second trace may be an open-ended trace, or the second trace may be a contact trace.

DETAILED DESCRIPTION OF THE INVENTION

Figure 1:
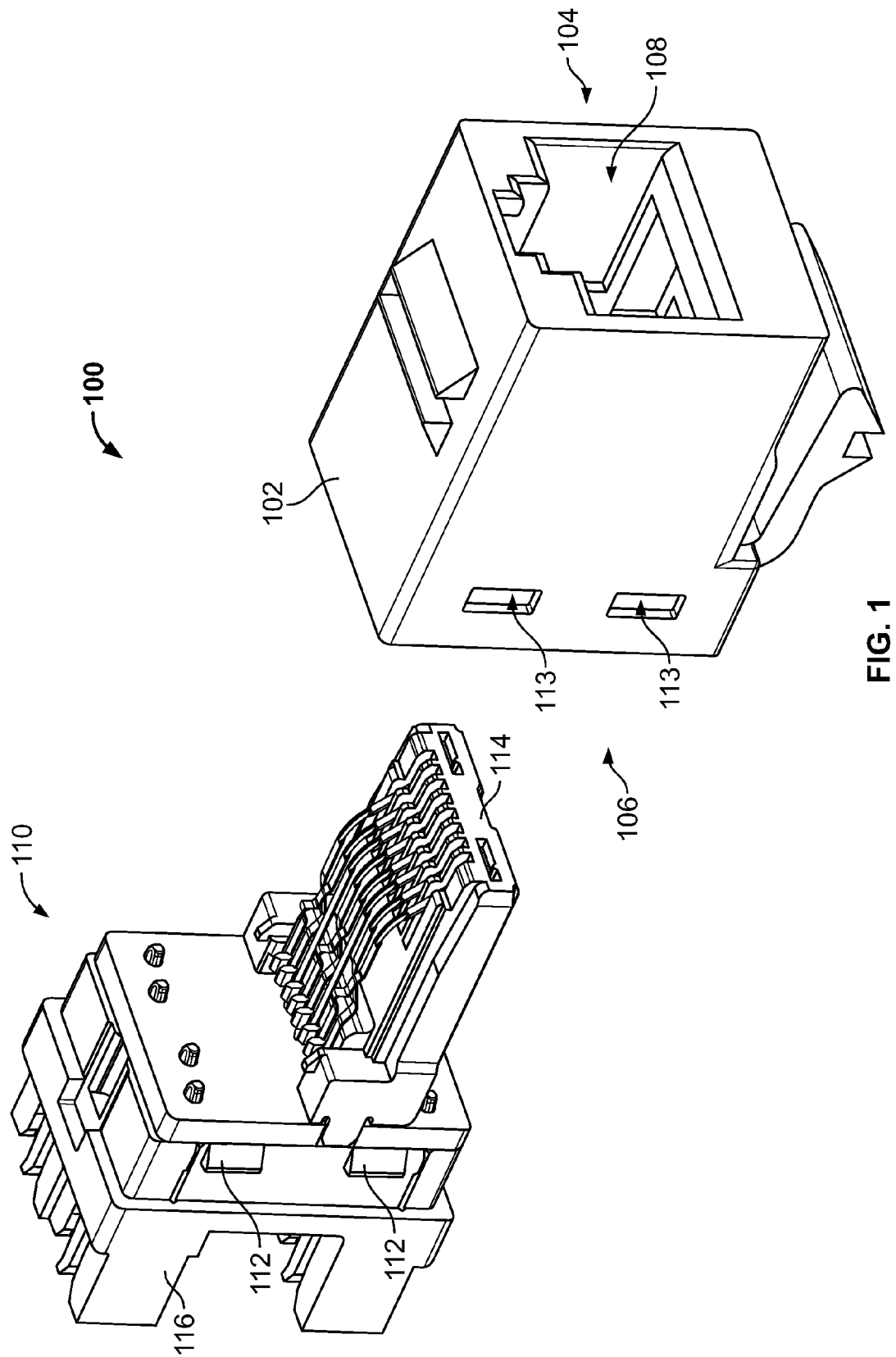
FIG. 1 is an exploded view of an electrical connector formed in accordance with one embodiment.

FIG. 1 is an exploded view of an electrical connector 100 formed in accordance with one embodiment. As shown, the connector 100 is a modular connector, such as an RJ-45 jack assembly. The connector 100 is configured for joining with a mating plug (not shown). While the connector 100 is shown and described with reference to an RJ-45 jack assembly, the subject matter herein may be used with other types of connectors, and the RJ-45 jack assembly is merely illustrative of an exemplary embodiment. The connector 100 may be used for data and/or power transmission and may also be used with differential pair multi-conductor transmission lines.

As will be discussed in greater detail below, embodiments described herein include circuit boards that utilize non-ohmic plates to improve the electrical performance of the connector 100 or any other device that the circuit board(s) may be used with. For example, the connector 100 may use one or more non-ohmic plates to reduce near-end crosstalk (NeXT) within the connector 100 and/or may be used to improve return loss. As used herein, the term "non-ohmic plates" refers to conductive plates that are not directly connected to any conductive material, such as traces or ground that may be in the connector 100. The non-ohmic plates may be positioned adjacent to open-ended traces within the circuit boards. As used herein, the term "open-ended" refers to traces that do not extend along or form a portion of the signal or return paths, i.e., the traces do not carry a current when the connector 100 is operational. When in use, the non-ohmic plate electromagnetically couples to the open-ended traces. In one embodiment, the non-ohmic plate affects the electrical performance of the electrical connector more effectively than known electrical connectors, because a broad surface of the non-ohmic plate faces the traces.

In other embodiments, the non-ohmic plate may be positioned adjacent to one or more open-ended traces and one or more traces that extend along a signal or return path (herein referred to as a "contact trace"). When in use, the non-ohmic plate in this embodiment may electromagnetically, i.e., magnetically and/or capacitatively couple to the open-ended and/or contact traces. As such, the non-ohmic plate and corresponding traces may be configured to control electrical performance.

As shown in FIG. 1, the connector 100 includes a housing 102 having a mating end 104 and a loading end 106 and a cavity 108 extending therebetween. When the connector 100 is fully assembled, the cavity 108 is configured to receive the mating plug through the mating end 104. Also shown in FIG. 1, the connector 100 may include a contact sub-assembly 110 that is received within the housing 102 through the loading end 106 when the connector is fully assembled. The contact sub-assembly 110 may be secured to the housing 102 by using tabs 112 that project away from sides of the contact sub-assembly 110 and are inserted into and engage corresponding windows 113 within the housing 102. Also shown, the contact sub-assembly 110 extends between a mating end 114 and a wire-terminating end 116. When the connector 100 is fully assembled, the contact sub-assembly 110 is held within the housing 102 such that the mating end 114 of the contact sub-assembly 110 is positioned proximate to the mating end 104 of the housing 102. The wire-terminating end 116 extends outward or rearward from the loading end 106 of the housing 102.

Figure 2:
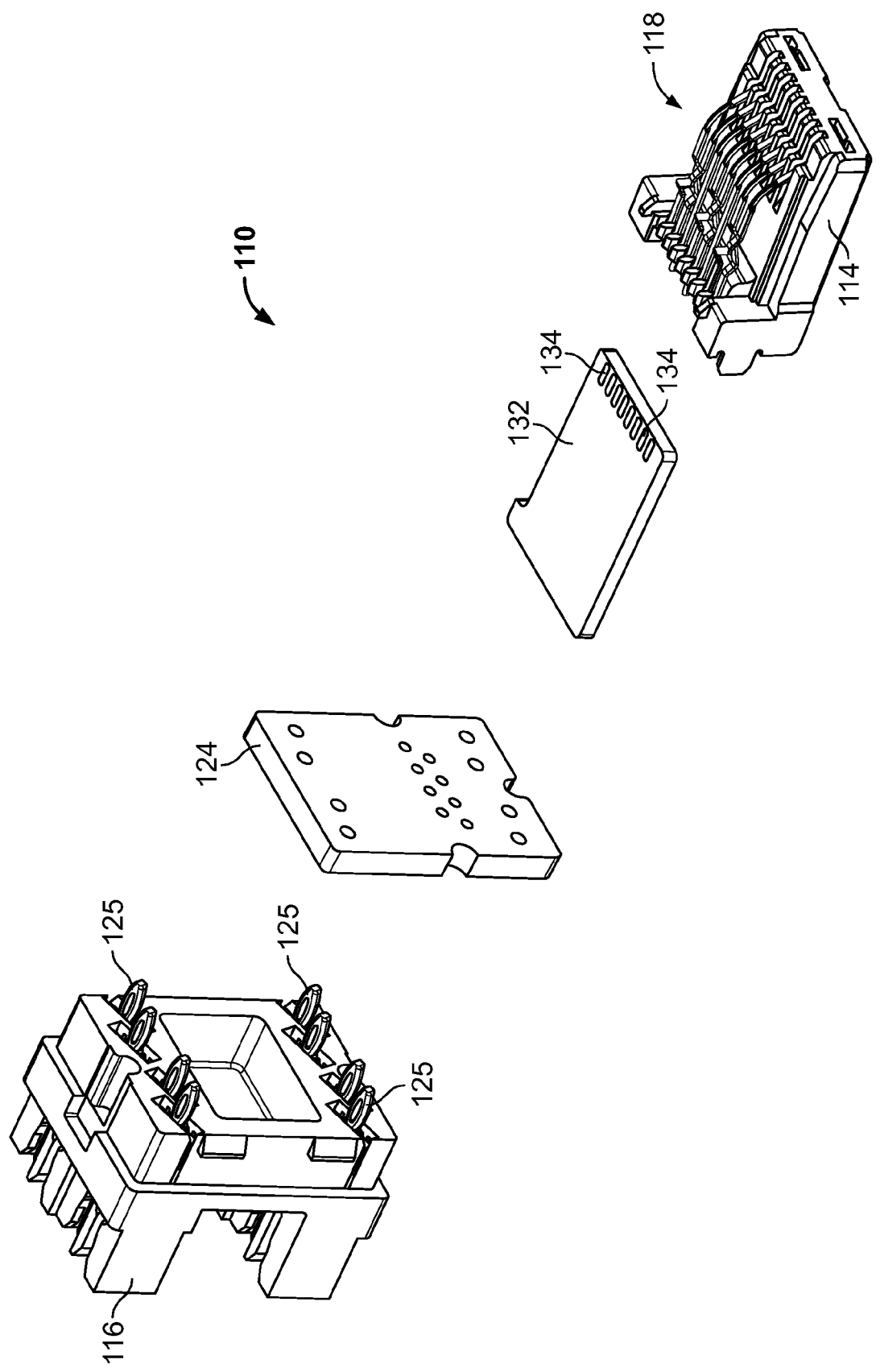
FIG. 2 is an exploded view of a contact-subassembly that may be used to form the connector shown in FIG. 1.

FIG. 2 is an exploded perspective view of the contact sub-assembly 110. As shown, the contact sub-assembly 110 may include the mating end 114, the wire-terminating end 116, and circuit boards 124 and 132. The circuit boards 124 and 132 are both configured to electrically connect to mating contacts 118. In the illustrated embodiment, the circuit board 132 includes a plurality of contact pads 134 on a surface of the circuit board 132. Also, the wire-terminating end 116 includes a plurality of insulation displacement contacts (IDCs) 125 that extend therethrough and are configured to engage the circuit board 124. The IDCs 125 are configured to receive and connect with wires (not shown) when the connector 100 is in operation. When the electrical connector 100 (FIG. 1) is fully assembled, the circuit board 132 is inserted into a cavity (not shown) of the mating end 114. The contact pads 134 are configured to engage corresponding contacts 118. While two circuit boards 124 and 132 are shown and described in the illustrated embodiment, any number of circuit boards may be provided in alternative embodiments. For example, some embodiments may include only a single circuit board.

Figure 3:
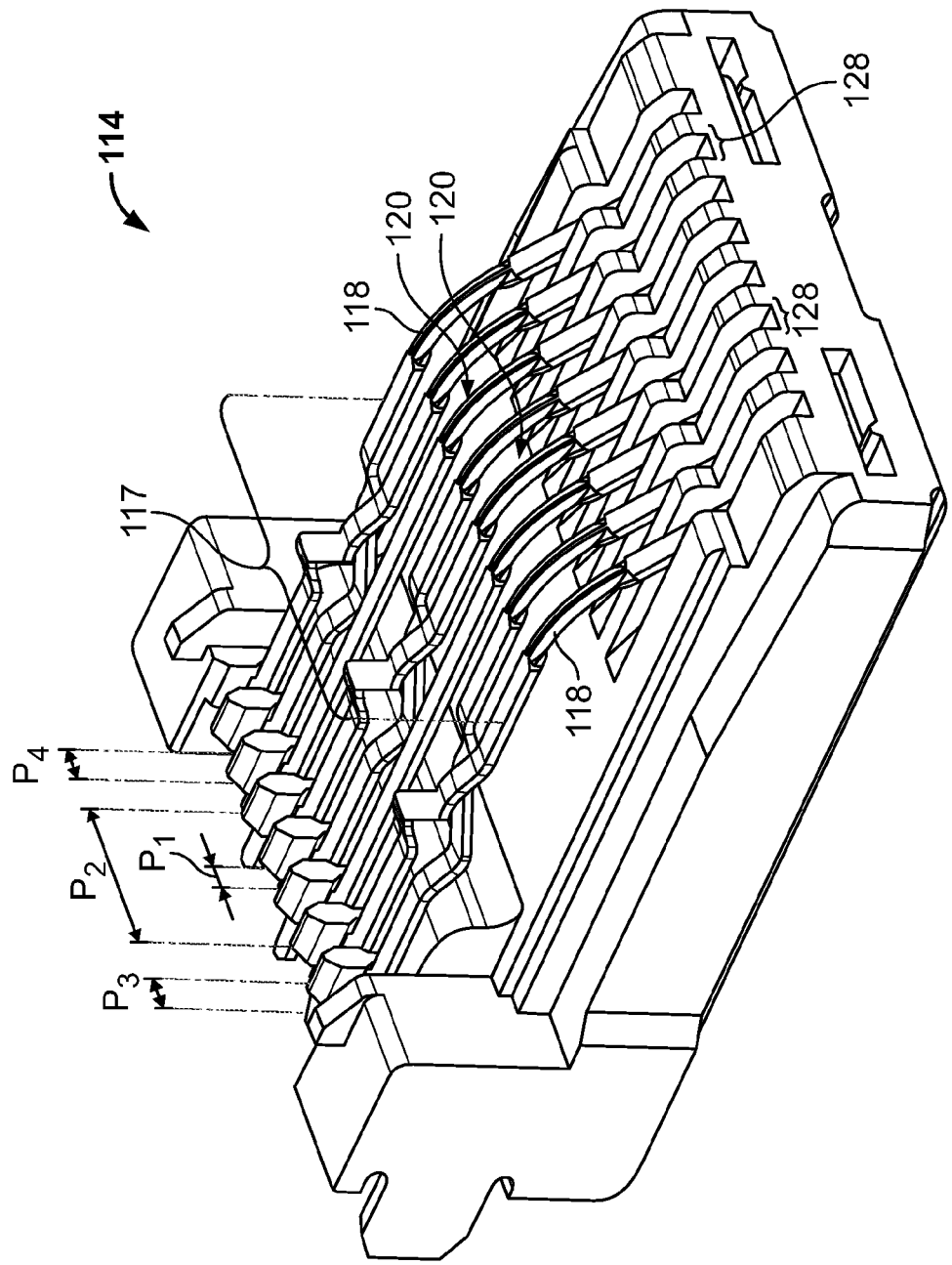
FIG. 3 is an enlarged perspective view of a mating end of the contact sub-assembly shown in FIG. 2.

FIG. 3 is an enlarged perspective view of the mating end 114 of the contact sub-assembly 110 (FIG. 1). As shown, the mating end 114 may include an array 117 of the contacts 118. The configuration of the array 117 of the contacts 118 may be controlled by industry standards, such as EIA/TIA-568. In the illustrated embodiment, the array 117 includes eight contacts 118 that are arranged as a plurality of differential pairs P1-P4. Each differential pair P1-P4 consists of two associated electrical contacts 118 in which one contact 118 provides an electrical signal path and the other contact 118 provides an electrical return path. As shown in FIG. 3, the differential pairs P3 and P4 are each proximate one side of the mating end 114 and each contact 118 of the differential pairs P3 and P4 is adjacent to the other contact 118 of the corresponding differential pair. However, the contacts 118 of the differential pair P2 are separated by the adjacent contacts 118 that form the differential pair P1. As such, near-end crosstalk may develop between the differential pairs P1 and P2. Furthermore, those having ordinary skill in the art understand that NEXT may be generated between other differential pairs depending upon the configuration of the electrical connector 100.

Also shown in FIG. 3, each of the contacts 118 includes a mating interface 120 and is configured to extend into a corresponding channel 128 such that portions of the contacts 118 are received in corresponding channels 128. Optionally, the contacts 118 are movable within the channels 128 to allow flexing of the contacts 118 as the connector 100 (FIG. 1) is mated with the mating plug. Furthermore, each of the contacts 118 may extend substantially parallel to one another and the mating interfaces 120 of each contact 118 may be generally aligned with one another. When the connector 100 is assembled, the interfaces 120 are arranged within the cavity 108 (FIG. 1) to interface with corresponding contacts (not shown) of the mating plug (not shown) when the mating plug is joined with the connector 100. As such, the mating interfaces 120 may be configured or may be positioned anywhere within the cavity 108 so that the contacts 118 form an electrical connection with the corresponding contacts of the mating plug. When the contacts 118 are engaged with the corresponding pins or contacts of the mating plugs, the contacts 118 may bend or flex into the contact pads 134 (FIG. 2) of the circuit board 132 (FIG. 2). Alternatively, the contacts 118 may be configured to engage or connect with contact pads 134 even when the mating plug is not engaged with the connector 100.

Figure 4:
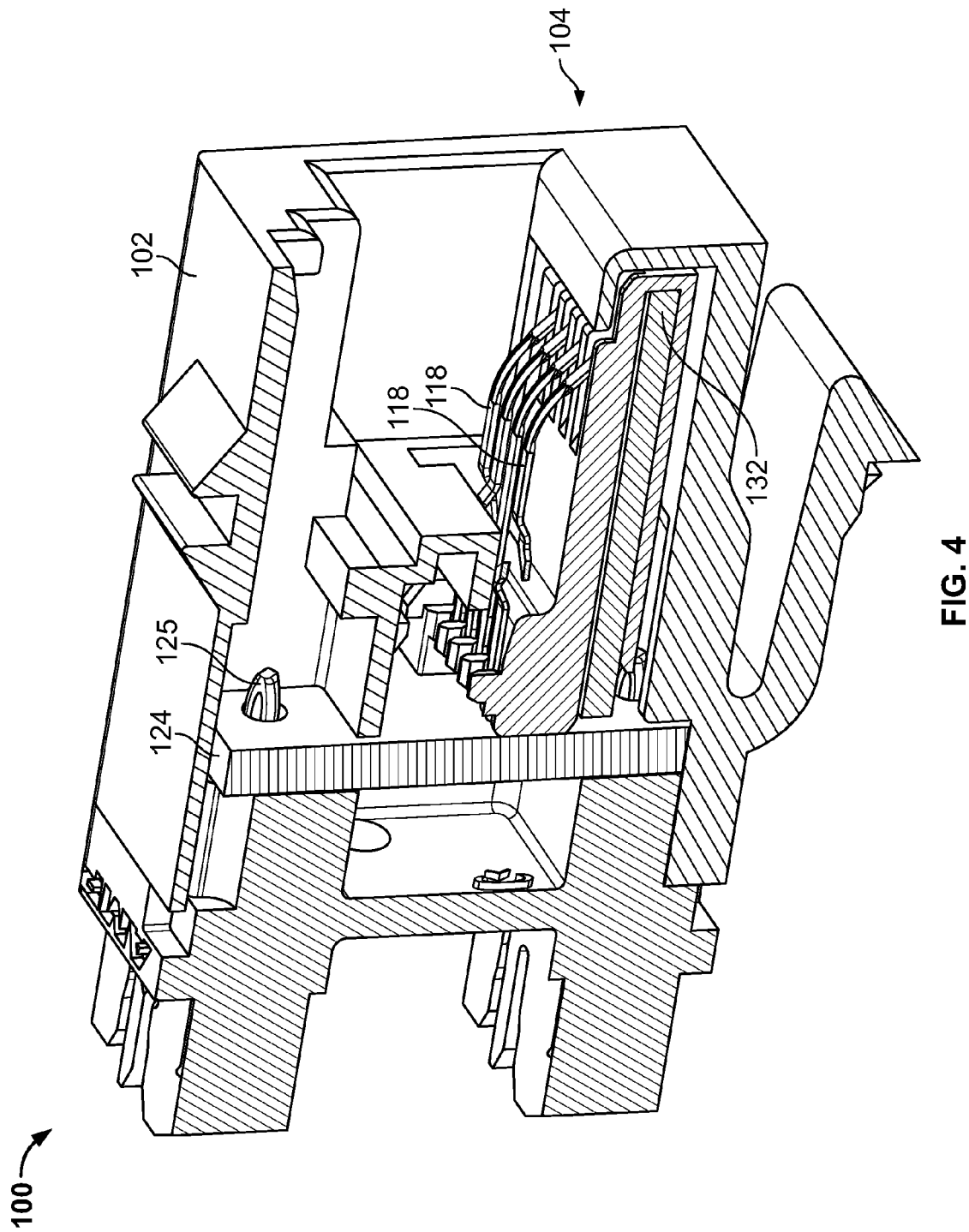
FIG. 4 is a cross-sectional view of the electrical connector shown in FIG. 1.

FIG. 4 illustrates a cross-sectional view of the fully assembled connector 100. When assembled, the circuit board 132 is positioned within the housing 102 such that the contacts 118 engage the contact pads 134 (FIG. 2). Other means of interconnecting the circuit board 132 and the contacts 118 may be provided in alternative embodiments. In an exemplary embodiment, the circuit boards 124 and 132 are substantially rectangular in shape. The circuit board 124 may be oriented vertically within the housing 102 such that the circuit board 124 is substantially perpendicular to, and spaced apart a predetermined distance from, the circuit board 132. As shown, the circuit board 124 may facilitate connecting the contacts 118 to the IDCs 125. Furthermore, the circuit board 132 may be positioned generally forward of the circuit board 124, in the direction of the mating end 104. The circuit board 124 may be positioned above the contacts 118.

However, the positions of the circuit boards 124 and 132 illustrated in FIG. 3 are only exemplary, and the circuit boards 124 and 132 may be positioned anywhere within the housing 102 in alternative embodiments. Additionally, the connector 100 may be configured such that the circuit boards 124 and 132 may engage and provide compensation for any number of the contacts 118.

Figure 5:
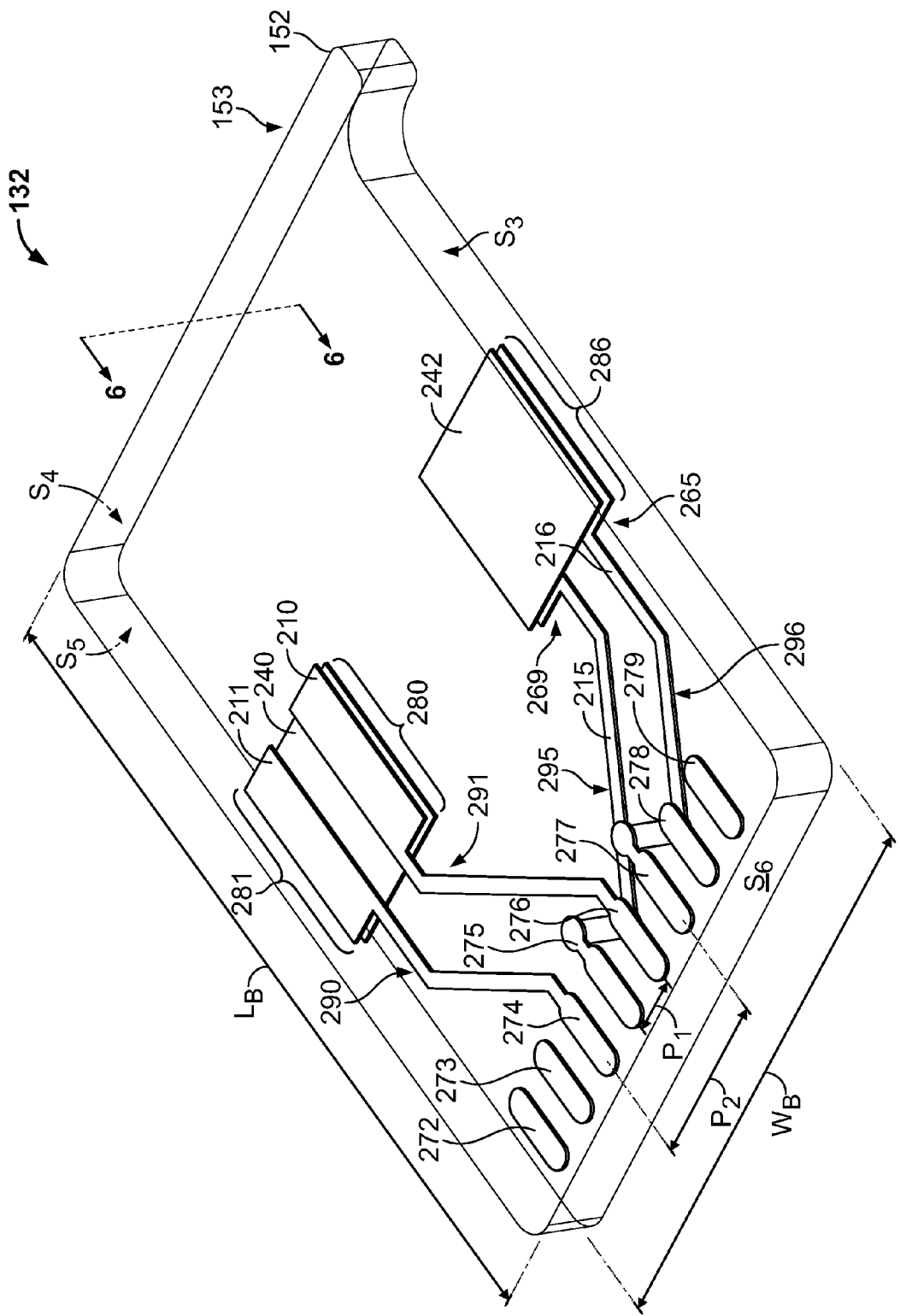
FIG. 5 is an isolated perspective view of a circuit board formed in accordance with one embodiment.
Figure 6:
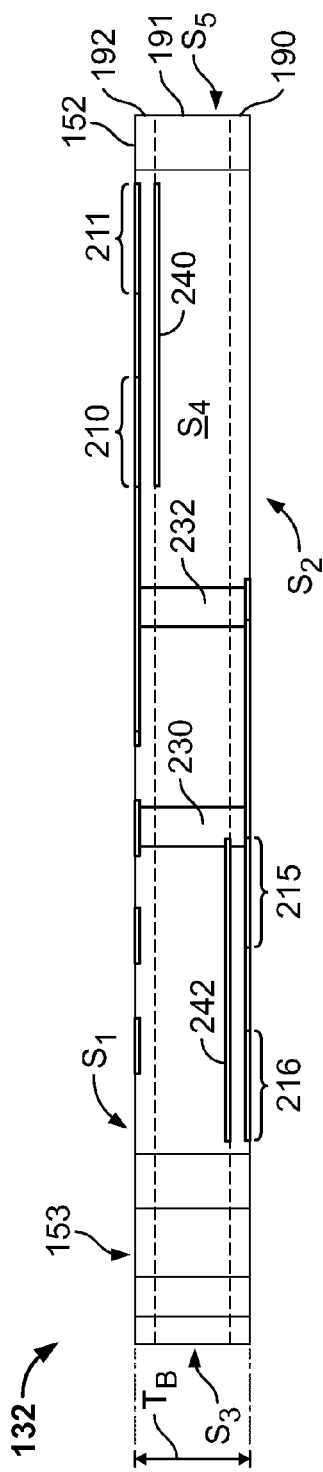
FIG. 6 is a front view of the circuit board shown in FIG. 5.

FIG. 5 is a perspective view of the circuit board 132, which may be used with the connector 100 (FIG. 1), and FIG. 6 is a side-view taken along the line 6-6 shown in FIG. 5. In the illustrated embodiment, the circuit board 132 includes a substrate body 152. The substrate body 152 may be formed from a dielectric material and may be substantially rectangular and have a length $L_B$ (FIG. 5), a width $W_B$ (FIG. 5), and a substantially constant thickness $T_B$ (FIG. 6). The substrate body 152 may also include a protruded portion 153. Alternatively, the substrate body 152 may be other shapes. The substrate body 152 includes a plurality of outer surfaces $S_1$-$S_2$ (FIG. 6), $S_3$-$S_5$, and $S_6$ (FIG. 5) that extend between edges of the substrate body 152. As shown in FIG. 6, the outer surfaces $S_1$ and $S_2$ are on opposite sides of the substrate body 152 and are separated by the thickness $T_B$. The surface $S_1$ may include a pair of open-ended traces 210 and 211 attached thereto and may also include a plurality of contact pads 272-279. The contact pads 272-279 may be aligned with respect to each other and proximate to an end of the circuit board 132 such that the contact pads 272-279 are proximate to the mating end 104 (FIG. 1).

As shown in FIG. 5, the surface $S_1$ may include a pair of open-ended traces 210 and 211 attached thereto that extend lengthwise along the surface $S_1$. Each trace 210, 211 includes the contact pad 274, 276, respectively, a coupling portion 280, 281, respectively, and a path portion 290, 291, respectively, that extends between and connects the associated contact pad to associated the coupling portion. Also, the surface $S_2$ may also include a pair of open-ended traces 215 and 216 attached thereto that extend lengthwise along the surface $S_2$. Each trace 215, 216 includes a coupling portion 285, 286, (FIG. 7) respectively, and a path portion 295, 296, respectively, that extends between and connects the associated contact pad to the associated coupling portion. The traces 215 and 216 are electrically connected to the contact pads 275 and 277 via through-holes 232 and 230 (FIG. 6). As shown, the traces 210 and 211 extend from the contact pads 274 and 276, respectively, and extend substantially parallel to each other along the surface $S_1$. The traces 210 and 211 may extend outward toward the side surface $S_5$ and then turn and extend lengthwise and terminate at a common position along the length $L_B$ of the substrate body 152. Also, the traces 215 and 216 extend substantial parallel to each other along the surface $S_2$ and outward toward the side surface $S_3$. The traces 215 and 216 then turn and extend lengthwise and terminate at a common position along the length $L_B$ of the substrate body 152.

In the illustrated embodiment, the traces 210 and 211 are co-planar along the surface $S_1$ and the traces 215 and 216 are co-planar along the surface $S_2$. However, although the circuit board 132 is described as having the traces 210 and 211 on the surface $S_1$ and the traces 215 and 216 on the surface $S_2$, alternative embodiments of the circuit board 132 may have more or fewer traces on $S_1$ and $S_2$ or on any of the other surfaces. Furthermore, the traces are not required to have a path as shown in FIG. 5. The patterns and positions of the traces and contact pads with respect to each other may be designed to cause a desired effect.

With reference to FIG. 6, the circuit board 132 may include the through-holes 230 and 232 that extend between the surfaces $S_1$ and $S_2$. More particularly, the holes 230 and 232 extend between the contact pads 277 and 275, respectively, and the surface $S_2$. As shown, the holes 230 and 232 may form channels that allow the corresponding contact pads 277 and 275, respectively, to be electrically connected to portions within the substrate body 152 and/or the opposing surface, if desired.

As such, when the connector 100 is fully assembled and in operation, the interconnecting contacts 118 (FIG. 2) are coupled to the contact pads 272-279, and more particularly, the traces 211 and 216 are electrically connected to the contacts 118 that form the differential pair P2 and the traces 210 and 215 are electrically connected to the contacts 118 forming the differential pair P1. More specifically, the trace 211 is electrically connected to the signal path of the differential pair P2, and the trace 216 is electrically connected to the return path of the differential pair P2. The trace 210 is electrically connected to the signal path of the differential pair P1, and the trace 215 is electrically connected to the return path of the differential pair P1. As such, the traces 210 and 211 are both connected to signal paths of different differential pairs, and the traces 215 and 216 are both connected to the return paths of different differential pairs.

Also shown in FIGS. 5 and 6, the circuit board 132 may include non-ohmic plates 240 and 242 embedded within the substrate body 152. Alternatively, the non-ohmic plates 240 and 242 may be positioned on or in contact with one or more of the surfaces $S_1$-$S_6$. As will be discussed in greater detail below, the non-ohmic plates 240 and 242 are configured and positioned relative to traces 210 and 211 and traces 215 and 216, respectively, to control the electrical performance of the connector 100 (FIG. 1). More particularly, the non-ohmic plate 240 is positioned with respect to coupling portions 280 and 281 of the traces 210 and 211, respectively, and the non-ohmic plate 242 is positioned with respect to coupling portions 285 and 286 of the traces 215 and 216. In one embodiment, the non-ohmic plates 240 and 242 and the coupling portions 280, 281, 285, and 286 are configured and positioned with respect to each other to reduce near end crosstalk.

In order to place the non-ohmic plates 240 and 242 into the substrate body 152, the substrate body 152 may be formed from outer layers 190 and 192 and a base layer 191 positioned therebetween. The non-ohmic plates 240 and 242 may be attached to or formed on surfaces of the base layer 191. Alternatively, the non-ohmic plate 240 may be placed on an inner surface of the outer layer 190, and the non-ohmic plate 242 may be placed on an inner surface of the outer layer 192.

Figure 7:
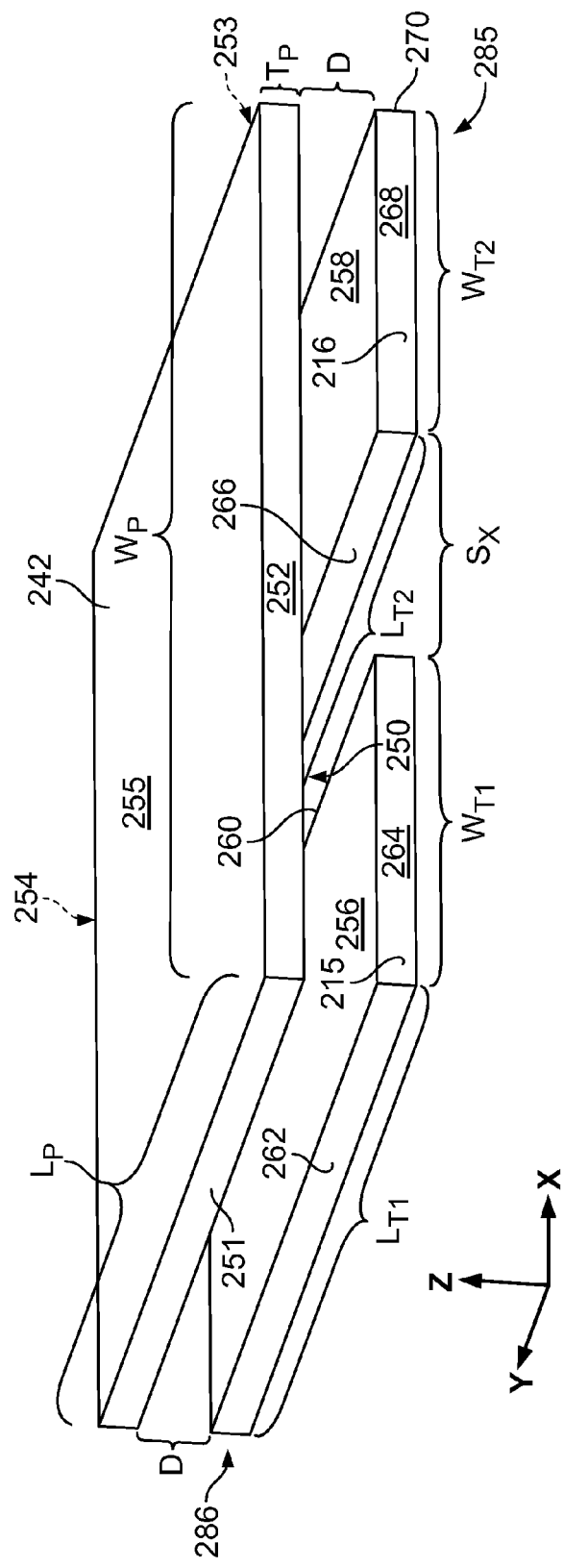
FIG. 7 is a perspective view of a non-ohmic plate and portions of traces that may be used with the circuit board shown in FIG. 5.

FIG. 7 illustrates the relationship between the non-ohmic plate 242 and portions of the traces 215 and 216 as positioned within the circuit board 132 (FIG. 5). Although the following discussion is with reference to the non-ohmic plate 242 and the traces 215 and 216, the discussion may be similarly applied to the non-ohmic plate 240 and associated traces 210 and 211. As discussed above, the non-ohmic plate 242 is "free-floating," i.e., does not contact either of the corresponding coupling portions 285 and 286 or any other conductive material that leads to one of the contacts 118 or ground. In the illustrated embodiment, the non-ohmic plate 242 is substantially rectangular and has a length $L_P$, a width $W_P$, and a thickness $T_P$. However, other embodiments may have a variety of geometric shapes. Furthermore, the non-ohmic plate 242 may have a plurality of surfaces including a coupling plate surface 250 and edge surfaces 251-254 and non-coupling surface 255. The surfaces 250-255 may be substantially planar. The edge surfaces 251-254 may be substantially perpendicular with respect to the plate surface 250, non-coupling surface 255, and each other. As shown, the non-ohmic plate 242 is positioned adjacent to the coupling portions 286 and 285 of the traces 215 and 216, respectively.

The coupling portions 286 and 285 may each respectively have a length $L_{T1}$ and $L_{T2}$ and a width $W_{T1}$ and $W_{T2}$. Each length $L_{T1}$ and $L_{T2}$ extends from a terminal edge surface 264 and 268, respectively, to an opposing terminal edge surface 265 and 269 (shown in FIG. 5). Furthermore, each coupling portion 286 and 285 may have a coupling trace surface 256 and 258, respectively. Also shown, the coupling portion 286 has an inner edge surface 260 and an outer edge surface 262. Likewise, the coupling portion 285 has an inner edge surface 266 and an outer edge surface 270. As shown in FIG. 7, the trace surfaces 256 and 258 face the plate surface 250. At least a portion of the trace surfaces 256 and 258 are separated from the plate surface 250 by a distance D. The trace surfaces 256 and 258 may form planes that coincide with each other such that the trace surfaces 256 and 258 share a common plane. The planes formed by the surfaces 256 and 258 may be substantially parallel to a plane formed by the plate surface 250.

As shown in FIG. 7, the non-ohmic plate 242 may be substantially laterally aligned with the coupling portions 285 and 286. As used herein, the non-ohmic plate 242 is "substantially aligned" with respect to the coupling portions 285 and 286 if an edge surface of the non-ohmic plate 242 is substantially co-planar with a proximate edge surface of one of the coupling portions 285 and 286. For example, the outer edge surfaces 262 and 270 may both be substantially aligned with the outer edge surfaces 251 and 253, respectively, of the non-ohmic plate 242. More specifically, the edge surfaces 262 and 251 may substantially share a common vertical plane (as formed by the Z and Y axes in FIG. 7) that extends lengthwise. Likewise, the edge surfaces 270 and 253 may substantially share a common vertical plane (not shown). In alternative embodiments, only one pair of edge surfaces 251 and 262 or edge surfaces 253 and 270 are substantially aligned. Furthermore, the adjacent edge surfaces of the non-ohmic plate 242 and the coupling portions 285 and 286 are not required to be in a common plane. For example, the plate surface 250 may extend beyond or fall short of the adjacent edge surfaces of the coupling portions 285 and 286.

Furthermore, the non-ohmic plate 242 may be substantially aligned at a terminal end of the non-ohmic plate 242. More specifically, the terminal edge surface 252 of the non-ohmic plate 242 may be substantially aligned with the terminal edge surfaces 264 and 268 of the coupling portions 286 and 285, respectively. As such, the terminal edge surfaces 264, 268, and 252 may all share a common vertical plane (as formed by the Z and X axes in FIG. 7) that extends widthwise.

Thus, the non-ohmic plate 242 may be terminally and/or laterally aligned with the coupling portions 285 and 286. In an alternative embodiment, the non-ohmic plate 242 is not aligned with either of the coupling portions 285 and 286, but overlaps all or a portion of the trace surfaces 256 and 258 and maintains the separation distance D between the plate surface 250 and the trace surfaces 256 and 258.

Also shown in FIG. 7, the inner edge surfaces 260 and 266 of the traces 215 and 216 may be separated by a predetermined distance $S_X$. In the illustrated embodiment, the width $W_P$ of the non-ohmic plate 242 is substantially equal to the combined width of the traces ($W_{T1}+W_{T2}$) plus the predetermined distance $S_X$. In one embodiment, the widths $W_{T1}$ and $W_{T2}$ are substantially equal.

When the circuit board 132 is in use, electromagnetic energy may travel down the coupling portion 285 of the trace 216. The coupling portion 285 may radiate the electromagnetic energy in the form of electric and magnetic fields that are coupled to the non-ohmic plate 242. The electromagnetic energy may then travel across the plate surface 250 and may be radiated from the plate surface 250 to the coupling portion 286. As such, the circuit board 132 may use non-ohmic proximity energy coupling to compensate or reduce crosstalk between the differential pairs P1 and P2 and/or improve the return loss. However, those having ordinary skill in the art will understand that an insignificant or minimal amount of capacitative and/or magnetic coupling may occur with other traces in the circuit board 132. As such, the type, position, geometric shape, and other factors relating to these traces may be considered when designing the circuit board 132.

With reference again to FIG. 5, in one embodiment, the path portions 295 and 296 may extend into the corresponding coupling portion 285 and 286 proximate to the edge surfaces 266 and 260 (FIG. 7), respectively. Furthermore, in one alternative embodiment, the non-ohmic plate 242 may be attached or formed on the surface $S_2$ between the coupling portions 285 and 286 of the traces 215 and 216, respectively. As such, the outer edge surfaces 251 and 253 of the non-ohmic plate 242 may be aligned edge-to-edge with the inner edge surfaces 260 and 266 of the coupling portions 286 and 285.

Figure 8:
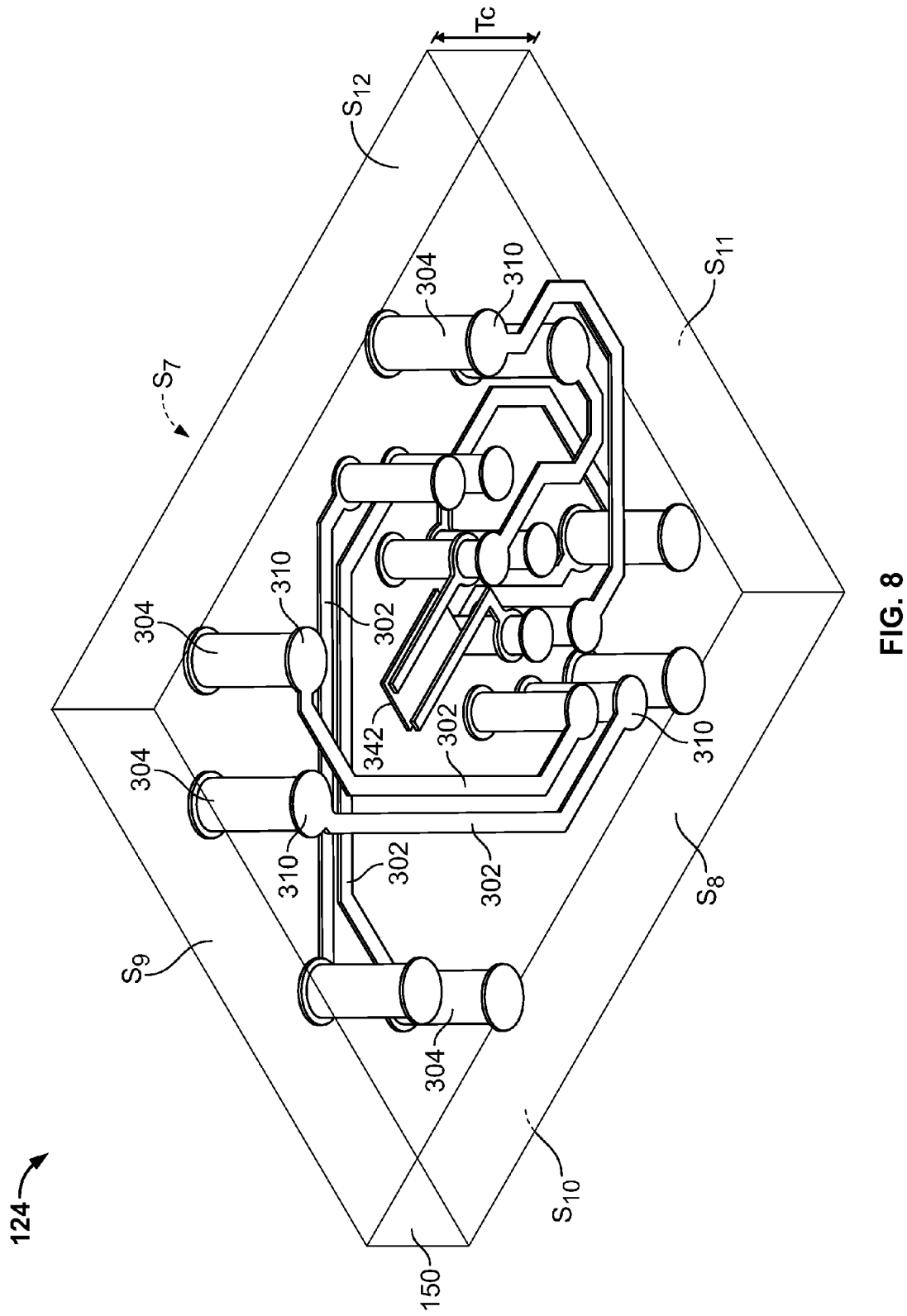
FIG. 8 is an isolated perspective view of a circuit board formed in accordance with an alternative embodiment.

FIG. 8 is a perspective view of the circuit board 124, which may also utilize the non-ohmic energy coupling feature discussed above with respect to the circuit board 132. As shown in FIG. 8, the circuit board 124 includes the substrate body 150. Although not shown, the substrate body 150 may be formed from multiple substrate layers as discussed with reference to the substrate body 152. Also, the substrate body 150 has a plurality of surfaces $S_7$-$S_{12}$ that extend between edges of the substrate body 150. The outer surfaces $S_7$ and $S_8$ are on opposite sides of the substrate body 150 and are separated by the thickness $T_C$. The surfaces $S_7$ and $S_8$ may include a plurality of conductor traces 302 that electrically connect the IDCs 125 (FIG. 2) to the contacts 118 (FIG. 3) via through-holes 304 and contact pads 310. As shown, the conductor traces 302 may have predetermined pattern configured for transmitting signals and/or power through the connector 100.

Figure 9:
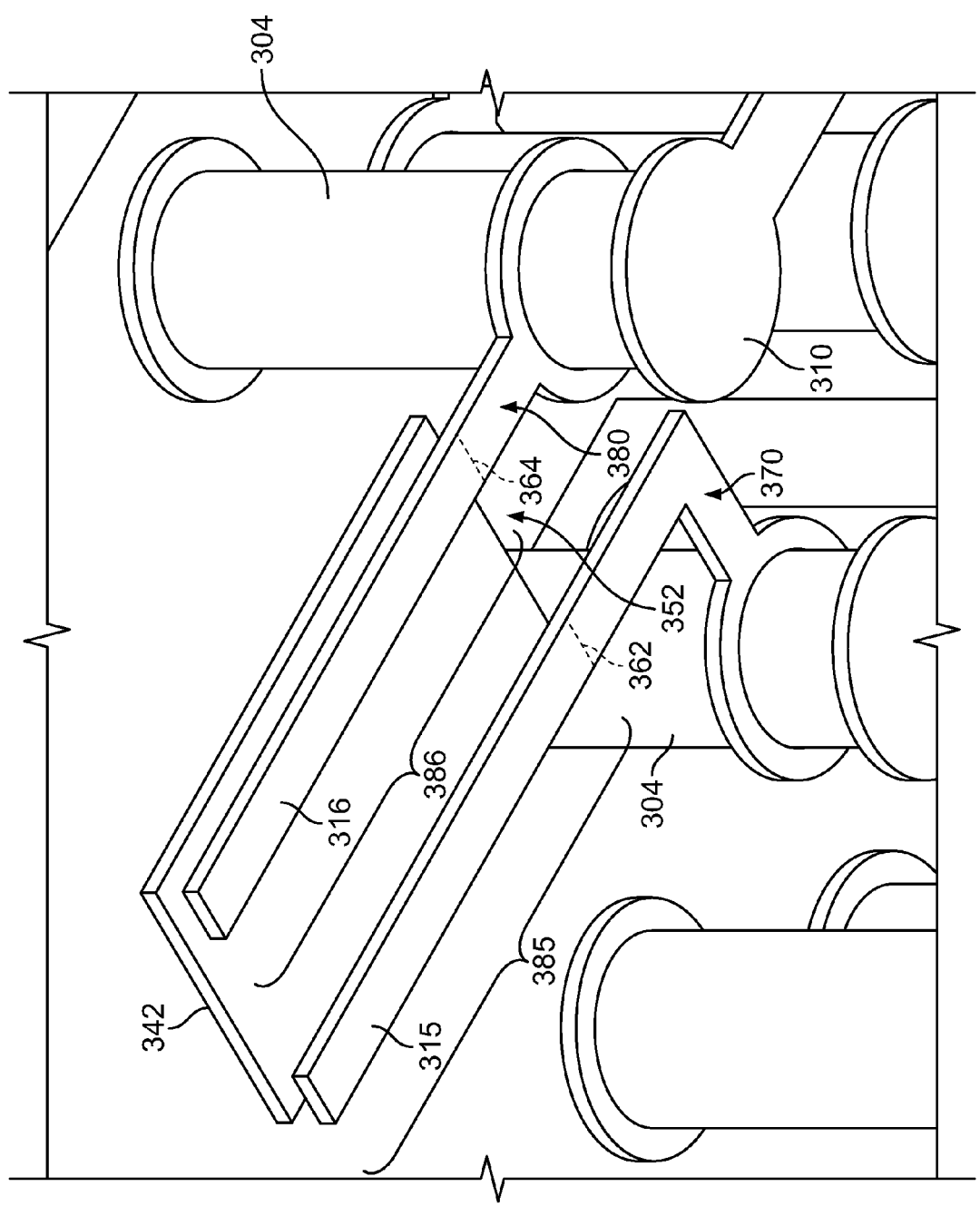
FIG. 9 is an enlarged portion of the circuit board shown in FIG. 8 illustrating a non-ohmic plate positioned with respect to open-ended traces.

FIG. 9 is an enlarged portion of the circuit board 124 (FIG. 8). The circuit board 124 may include open-ended traces 315 and 316, which are electrically connected to corresponding through-holes 304. The traces 315 and 316 may have similar features as described above with reference to the traces 215 and 216 in FIGS. 5-7. Furthermore, the circuit board 124 may include a non-ohmic plate 342 that has similar features as described above with reference to the non-ohmic plate 242 in FIGS. 5-7. Although the traces 315 and 316 include portions that couple to the non-ohmic plate 342, the portions are not wider than a width of the corresponding trace as shown in FIG. 7 with respect to the coupling portions 285 and 286. As shown in FIG. 9, the non-ohmic plate 342 includes an inner edge surface 352 that faces or is proximate to the through-holes 304. Similar to the pair of traces 210 and 211 and the pair of traces 215 and 216, the traces 315 and 316 each include a path portion 370 and 380, respectively, that extends from the corresponding through-hole 304 to a longitudinal position on the traces 315 and 316 (indicated as hashed lines 362 and 364, respectively) that is proximate to the edge surface 352. The lengths of the path portions 370 and 380 may be different with respect to each other and may be configured to have desired effects on the electrical performance of the connector 100 (FIG. 1). Furthermore, the traces 315 and 316 include coupling portions 385 and 386 respectively. As shown in FIG. 9, the non-ohmic plate 342 is laterally and terminally aligned with the coupling portions 385 and 386.

Figure 10:
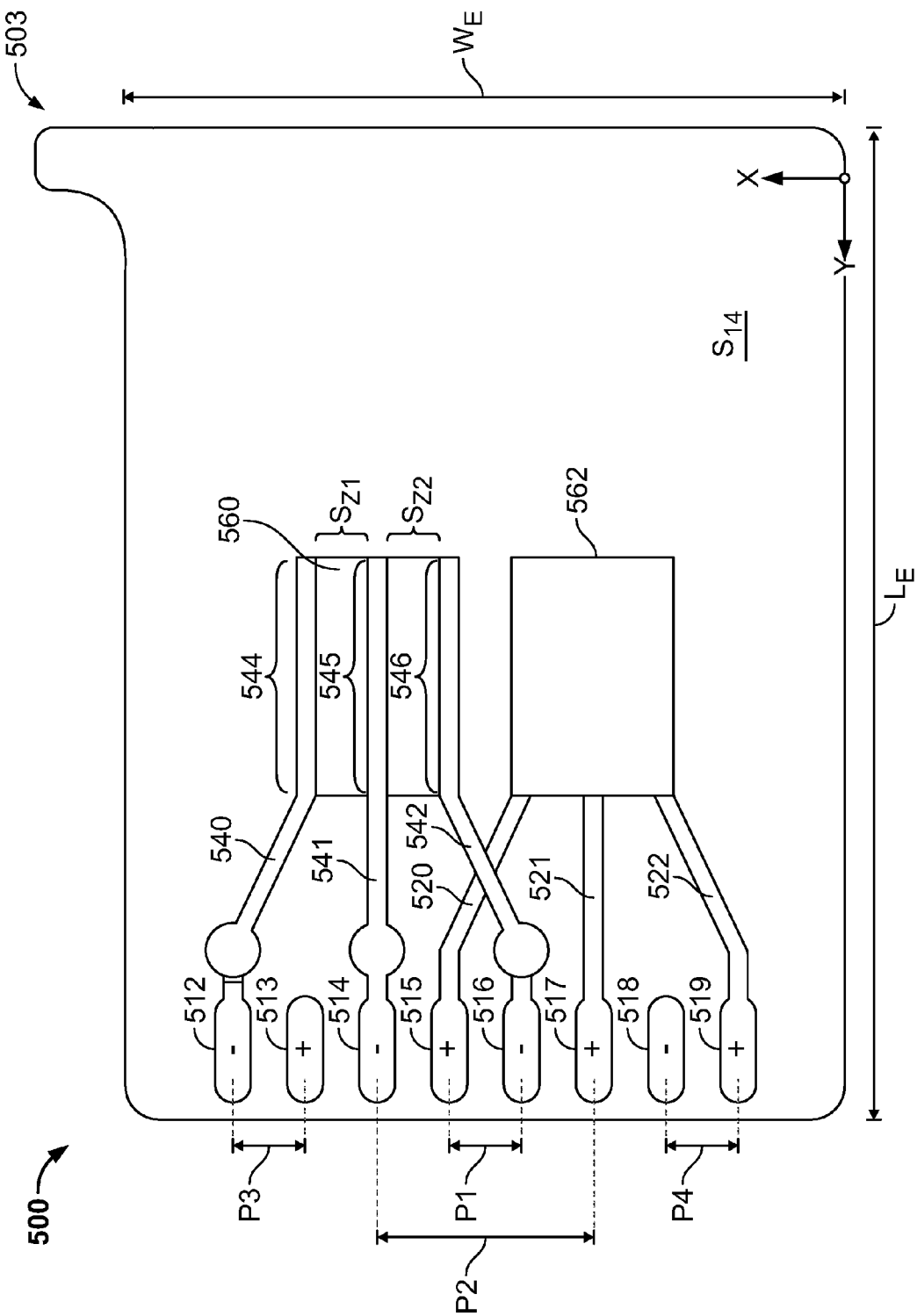
FIG. 10 is a planar view of a circuit board formed in accordance with an alternative embodiment.
Figure 11:
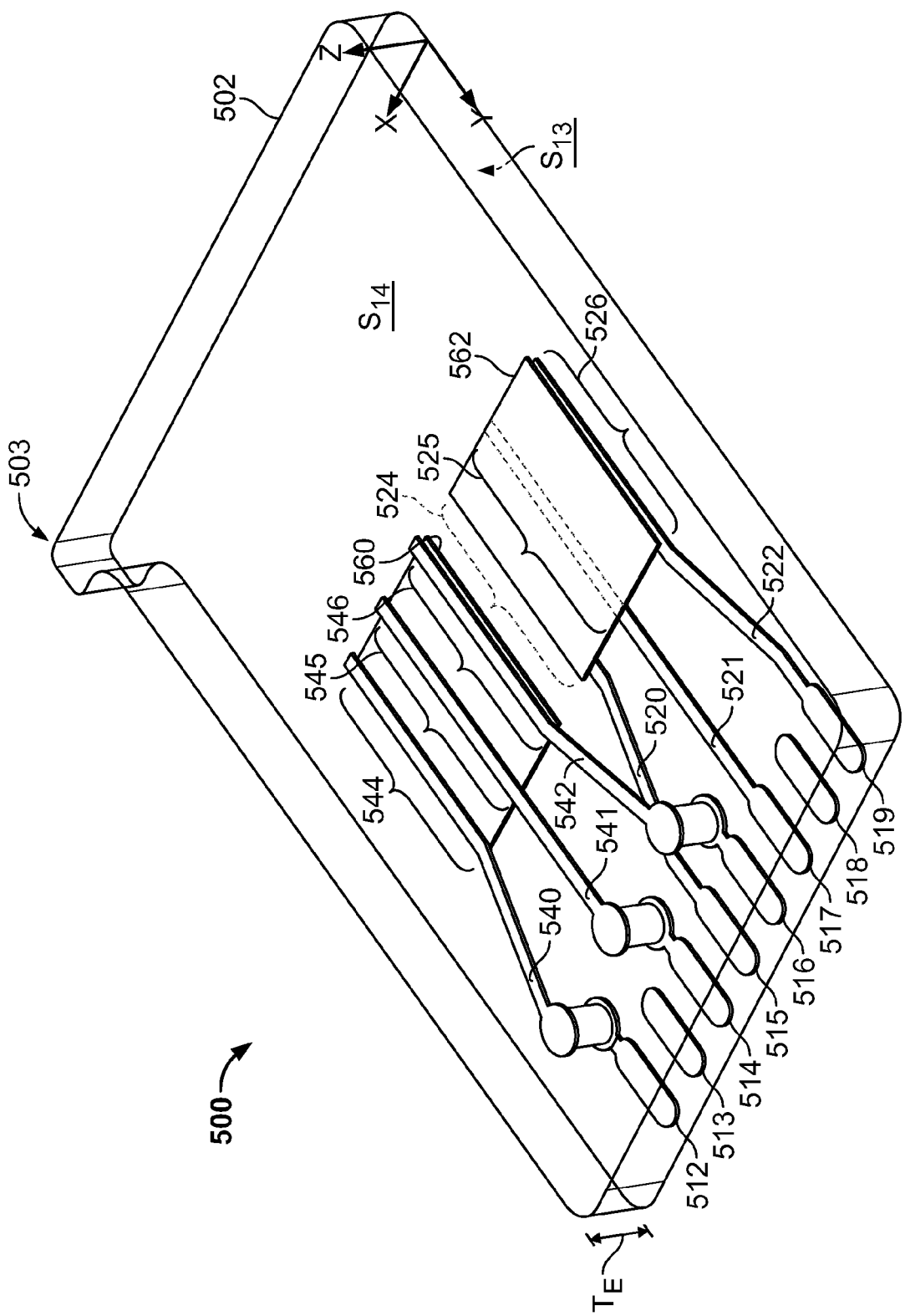
FIG. 11 is a perspective view of the circuit board shown in FIG. 10.

FIGS. 10 and 11 illustrate a circuit board 500 formed in accordance with an alternative embodiment. FIG. 10 is a bottom planar view and FIG. 11 is a bottom perspective view of the circuit board 500. The circuit board 500 may be used with the connector 100 (FIG. 1). In the illustrated embodiment, the circuit board 500 includes a substrate body 502 (FIG. 11) that may be formed from a plurality of layers, such as layers 190-192 discussed above with reference to the substrate body 152. The substrate body 502 may have a length $L_E$ (FIG. 10), a width $W_E$ (FIG. 10), and a substantially constant thickness $T_E$ (FIG. 11). The substrate body 502 may also include a protruded portion 503. In other embodiments, the substrate body 502 may be other shapes. The substrate body 502 includes a plurality of outer surfaces, including opposing outer surfaces $S_{13}$ (FIG. 11) and $S_{14}$. The surface $S_{13}$ may have a plurality of contact pads 512-519, which may be aligned with respect to each other and proximate to an end of the circuit board 502 such that the contact pads 512-519 are proximate to the mating end 104 (FIG. 1).

As shown in FIG. 11, the surface $S_{13}$ may also include a plurality of open-ended traces 520-522 attached thereto that extend lengthwise along the surface $S_{13}$. Each trace 520-522 includes the contact pad 515, 517, and 519, respectively, a coupling portion 524, 525, and 526, respectively, and a path portion (not enumerated) that extends between and connects the associated contact pad to associated the coupling portion. Also, the surface $S_{14}$ may also include a plurality of open-ended traces 540-542 attached thereto that extend lengthwise along the surface $S_{14}$. Each trace 540-542 is electrically connected to a corresponding contact pad 512, 514, and 516, respectively, via through-holes. Each trace 540-542 also includes a coupling portion 544, 545, and 546, respectively, and a path portion (not enumerated) that extends between and connects the associated contact pad to the associated coupling portion. The path portions for the traces 540-542 and 520-522 may be similar to the path portions described with reference to the circuit board 132 above. Also shown in FIGS. 10 and 11, the circuit board 500 may include non-ohmic plates 560 and 562 embedded within the substrate body 502. Alternatively, the non-ohmic plates 560 and 562 may be positioned on or in contact with one or more of the surfaces of the substrate body 502.

The non-ohmic plates 560 and 562 may be configured and positioned with respect to traces 540-542 and traces 520-522, respectively, to control the electrical performance of the circuit board 500 and/or the connector 100 (FIG. 1). The non-ohmic plates 560 and 562 and the corresponding traces may be configured with respect to each other as described above in reference to the non-ohmic plates 240 and 242. However, the circuit board 500 includes three open-ended traces electromagnetically coupled to the corresponding non-ohmic plates 560 and 562. More specifically, the non-ohmic plate 560 may be electromagnetically coupled to the coupling portions 544-546 of the respective traces 540-542. As shown in FIG. 10, the traces 540-542 are electrically coupled to the return path of the contacts 118 that correspond with differential pairs P3, P2, and P1, respectively. Also, the traces 520-522 are electrically coupled to the signal or source path of the contacts 118 that correspond with differential pairs P1, P2, and P4, respectively.

Similar to above, the circuit board 500 may use non-ohmic proximity energy coupling to compensate or reduce crosstalk that may occur among the differential pairs P1-P4 and/or improve the return loss. As an example, electromagnetic energy may travel down the corresponding coupling portions 544 of the trace 540. The coupling portion 544 may radiate the electromagnetic energy in the form of electric and magnetic fields that are coupled to the non-ohmic plate 560. The electromagnetic energy may then travel across a surface of the non-ohmic plate 560 and may be radiated from the surface to the coupling portion 545 and/or the coupling portion 546.

Similarly, electromagnetic energy radiated from the coupling portion 545 may travel along the surface of the non-ohmic plate 560 and may be radiated from the surface to the coupling portion 544 and/or 546.

Furthermore, as shown in FIG. 10, the coupling portions 544-546 may be separated from each other by predetermined distances and extend widthwise and adjacent to the surface of the non-ohmic plate 560. As shown, the coupling portions 544 and 545 are separated by a predetermined distance $S_{Z1}$ and the coupling portions 545 and 546 are separated by a predetermined distance $S_{Z2}$. In the illustrated embodiment, the distances $S_{Z1}$ and $S_{Z2}$ are substantially equal. However, in alternative embodiments, the distances may not be equal such that the coupling portions 544-546 are not equally distributed. Also, in the illustrated embodiment, the coupling portions 544 and 546 may be substantially aligned with edge surfaces of the non-ohmic plate 560 and the coupling portions 545-546 may have terminal edge surfaces that extend to and are substantially aligned with the a terminal edge surface of the non-ohmic plate 560.

In addition to the exemplary embodiment shown in FIGS. 10 and 11, other embodiments may include more than three coupling portions adjacent to each non-ohmic plate. Depending upon the desired effect, these coupling portions may or may not be distributed evenly across the width of the adjacent non-ohmic plate. Furthermore, the coupling portions may each be separated from the corresponding non-ohmic plate a common distance or some of the coupling portions may be closer or further away from the corresponding non-ohmic plate than other coupling portions.

Figure 12:
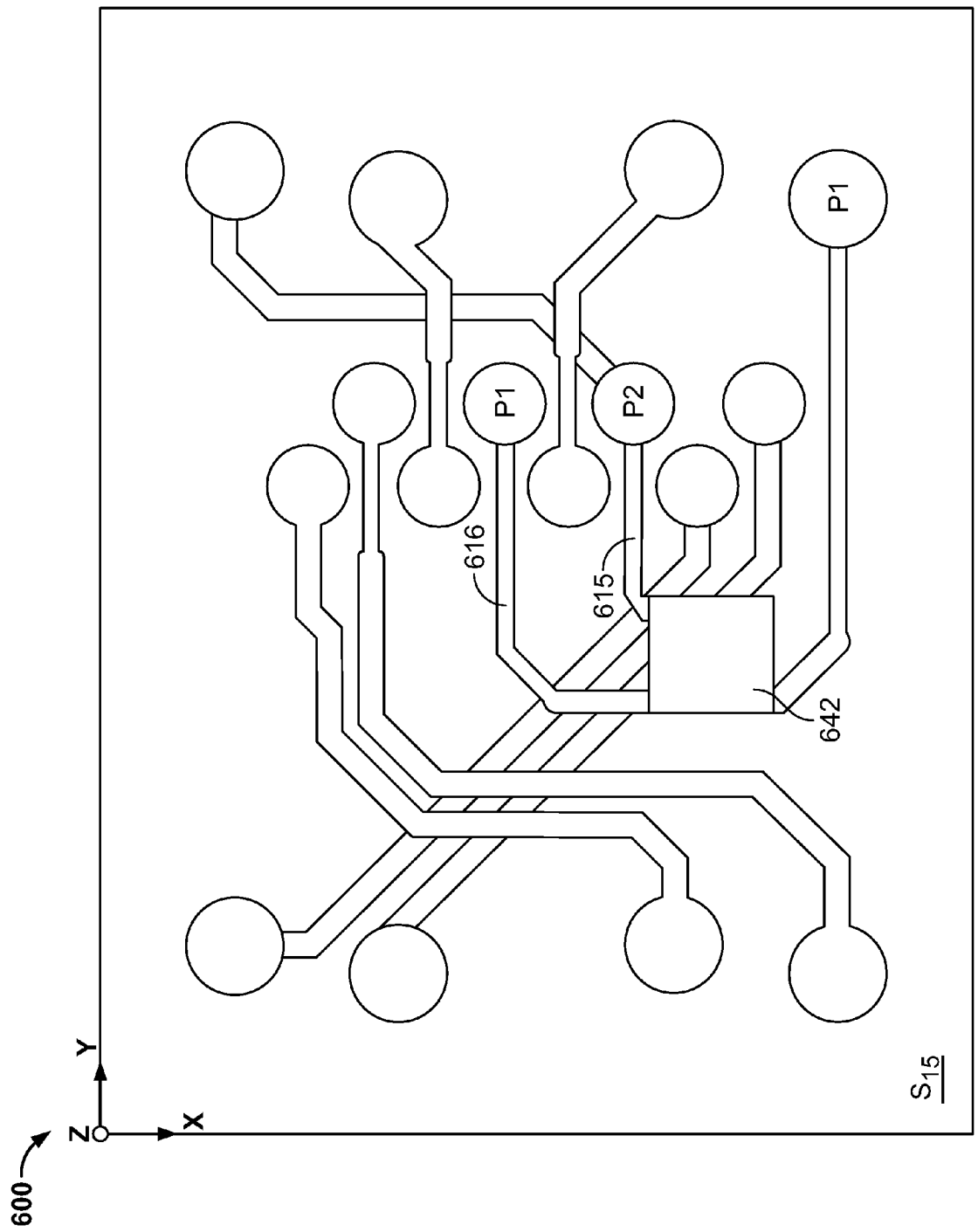
FIG. 12 is a planar view of a circuit board formed in accordance with an alternative embodiment.
Figure 13:
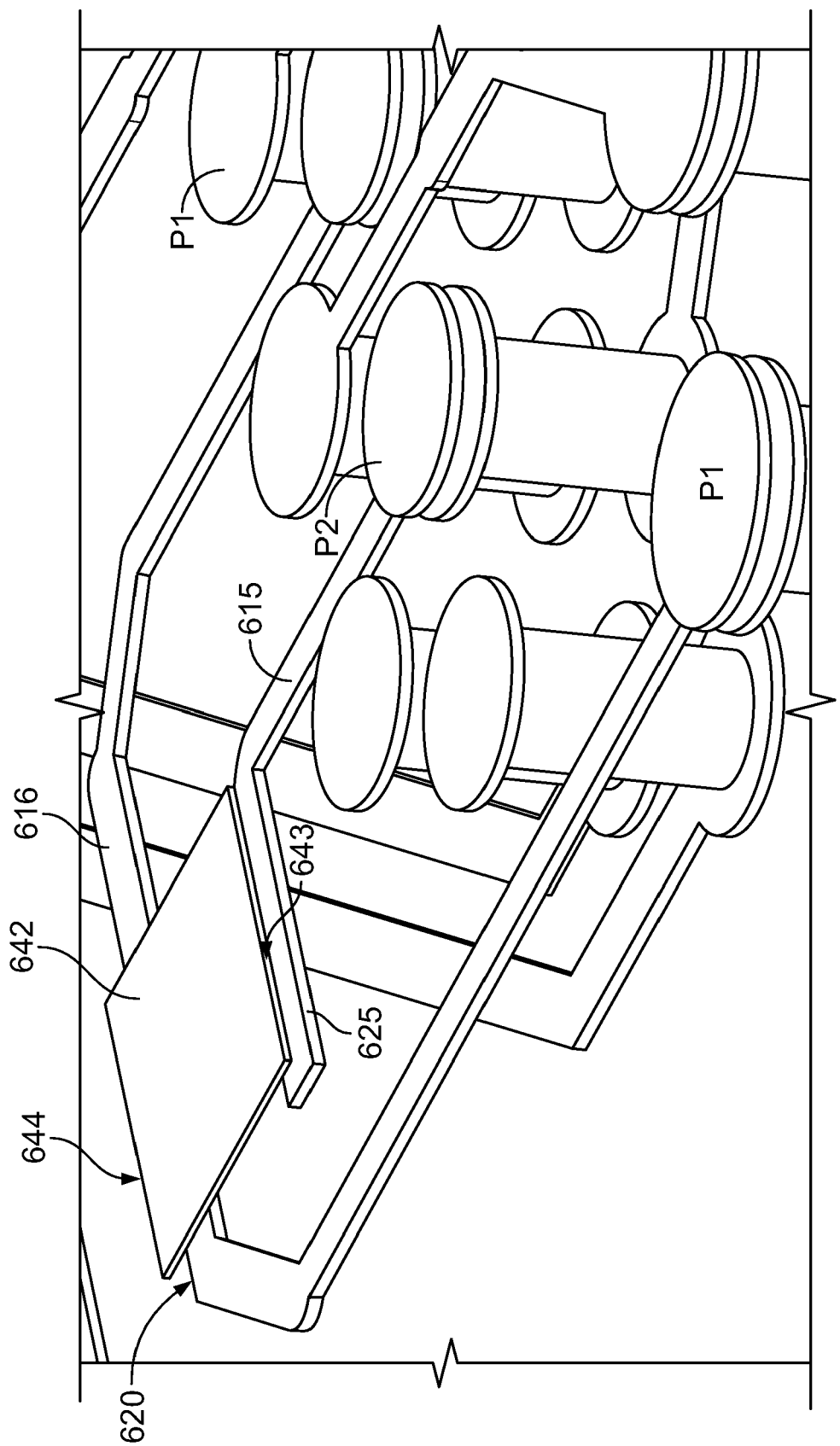
FIG. 13 is a perspective view of a portion of the circuit board shown in FIG. 12.

FIGS. 12 and 13 illustrate a circuit board 600 formed in accordance with an alternative embodiment. FIG. 12 is a top planar view and FIG. 13 is a perspective view of a portion of the circuit board 600. The circuit board 600 may be similarly configured as the circuit board 124 described with reference to FIGS. 8 and 9. More specifically, the circuit board 600 may include a plurality of traces, including an open-ended trace 615 and a contact trace 616. The open-ended trace 615 may be electrically coupled the return path of the differential pair P2, and the contact trace 616 may be electrically coupled to the signal path of the differential pair P1.

Furthermore, the circuit board 600 may include a non-ohmic plate 642 that has similar features as described above with reference to the non-ohmic plate 342 in FIGS. 8 and 9. In the illustrated embodiment, the non-ohmic plate 642 is positioned along an outer surface $S_{15}$ of the circuit board 600. Alternatively, the non-ohmic plate 642 may be positioned or embedded within the substrate body of the circuit board 600.

As shown in FIG. 13, the open-ended trace 615 may have a side edge surface 625 that is substantially aligned with an edge surface 643 of the non-ohmic plate 642. The contact trace 616 may have a side edge surface 620 that is substantially aligned with an edge surface 644 of the non-ohmic plate 642. The open-ended trace 615 and the contact trace 616 may have similar features and configurations with respect to each other as the traces 215 and 216 discussed with reference to FIGS. 5-7. Furthermore, the open-ended trace 615 and the contact trace 616 may be positioned and configured similarly with respect to the non-ohmic plate 642 as the traces 215 and 216 were positioned and configured with respect 242 shown in FIG. 7. As such, the circuit board 600 may use non-ohmic proximity energy coupling to compensate or reduce crosstalk that may occur among the differential pairs and/or improve the return loss. However, because one trace is open-ended and another trace extends along a signal or return path, the non-ohmic plate 642 may capacitatively couple and/or magnetically couple the open-ended trace 615 and the contact trace 616.

Although FIG. 13 illustrates only one open-ended trace 615 and one contact trace 616, alternative embodiments may include multiple open-ended traces 615, such as the multiple open-ended traces shown in FIGS. 10 and 11, that capacitatively couple and/or magnetically couple with one or more contact traces. Furthermore, alternative embodiments may include one open-ended trace that couples with multiple contact traces.

As shown above, embodiments described herein may include circuit boards and connectors that utilize non-ohmic plates for electromagnetically coupling to open-ended traces. Furthermore, embodiments described herein may include circuit boards and connectors that utilize non-ohmic plates that capacitatively and/or magnetically couple open-ended trace (s) to contact trace(s). As discussed above, the features of the non-ohmic plates and corresponding traces may be configured to cause desired effects on the electrical performance. For example, the areas of the plate surface and trace surfaces that face each other may be configured for a desired effect. In particular, the length of the non-ohmic plate, the widths of the plate and corresponding traces, the distance separating surfaces of the non-ohmic plate and corresponding traces, the distance separating the edges of the traces, and the length of the traces corresponding to the non-coupled portions may all be configured for desired effect. Although the circuit boards 124, 132, 500, and 600 have been specifically described herein, alternative embodiments include circuit boards that include one or more features described with reference to one particular circuit board (e.g., 124) and include one or more features described with reference to another circuit board (e.g., 600). Thus, it is to be understood that the above description is intended to be illustrative, and not restrictive. As such, the above-described embodiments (and/or aspects thereof) may be used in combination with each other.

In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. An electrical connector comprising:
   a housing;
   a plurality of contacts within the housing configured to engage with mating contacts of a mating connector, the contacts forming at least a first differential pair and a second differential pair; and
   a circuit board housed within the housing, the circuit board comprising:
      a substrate body formed from a dielectric material and including a first trace electrically coupled to a contact of the first differential pair and a second trace electrically coupled to a contact of the second differential pair, wherein at least one of the first and second traces is an open-ended trace; and
      a non-ohmic plate positioned adjacent to the traces, wherein the plate is positioned to electromagnetically couple the first and second traces to each other and the non-ohmic plate and traces are configured for a desired electrical performance.

2. An electrical connector in accordance with claim 1 wherein the non-ohmic plate is positioned within the substrate body.

3. An electrical connector in accordance with claim 1 wherein the non-ohmic plate has a plate surface and the first and second traces each have a trace surface, the non-ohmic plate positioned within the substrate body such that the plate surface faces and extends parallel to the trace surfaces.

4. An electrical connector in accordance with claim 1 wherein the non-ohmic plate has a plate length and a plate width and the first and second traces have substantially equal trace widths and are separated by a predetermined distance, wherein the plate length extends parallel to the first and second traces in a common direction and the plate width is substantially equal to two times the trace width plus the predetermined distance.

5. An electrical connector in accordance with claim 1 wherein the first and second traces each have an outer edge surface extending lengthwise along the substrate body and the non-ohmic plate has two opposing outer edge surfaces extending lengthwise within the substrate body, wherein at least one of the outer edge surfaces of the first and second traces is substantially aligned with at least one of the outer edge surfaces of the non-ohmic plate.

6. An electrical connector in accordance with claim 1 wherein the non-ohmic plate is positioned to capacitatively couple and magnetically couple the first and second traces to each other.

7. An electrical connector in accordance with claim 1 further comprising a contact sub-assembly, the sub-assembly being received within the housing and including the plurality of contacts and the circuit board.

8. An electrical connector in accordance with claim 1 further comprising a third trace electrically coupled to a contact of a third differential pair, the third trace being one of an open-ended trace and a contact trace, wherein the non-ohmic plate is positioned to electromagnetically couple the first, second, and third traces to each other and the non-ohmic plate and the traces are configured for a desired electrical performance.

9. An electrical connector in accordance with claim 1 wherein the second trace is an open-ended trace.

10. An electrical connector in accordance with claim 1 wherein the second trace is a contact trace.

11. A circuit board configured to be electrically connected to a plurality of contacts forming a plurality of differential pairs, the circuit board comprising:
   a substrate body formed from a dielectric material and including a first trace electrically coupled to a contact of a first differential pair and a second trace electrically coupled to a contact of a second differential pair, wherein at least one of the first and second traces is an open-ended trace; and a non-ohmic plate positioned adjacent to the traces, wherein the non-ohmic plate is positioned to electromagnetically couple the first and second traces to each other and the non-ohmic plate and traces are configured for a desired electrical performance.

12. A circuit board in accordance with claim 11 wherein the non-ohmic plate is positioned within the substrate body.

13. A circuit board in accordance with claim 11 wherein the non-ohmic plate has a plate surface and the first and second traces each have a trace surface, the non-ohmic plate positioned within the substrate body such that the plate surface faces and extends parallel to the trace surfaces.

14. A circuit board in accordance with claim 11 wherein the non-ohmic plate has a plate length and a plate width and the first and second traces have substantially equal trace widths and are separated by a predetermined distance, wherein the plate length extends parallel to the first and second traces in a common direction and the plate width is substantially equal to two times the trace width plus the predetermined distance.

15. A circuit board in accordance with claim 11 wherein the first and second traces each have an outer edge surface extending lengthwise along the substrate body and the non-ohmic plate has two opposing outer edge surfaces extending lengthwise within the substrate body, wherein at least one of the outer edge surfaces of the first and second traces is substantially aligned with at least one of the outer edge surfaces of the non-ohmic plate.

16. A circuit board in accordance with claim 15 wherein the non-ohmic plate includes a terminal edge surface extending widthwise within the substrate body and each of the first and second traces includes a terminal edge surface, wherein both of the outer edge surfaces of the non-ohmic plate are substantially aligned with the outer edge surfaces of the first and second traces and the terminal edge surface of the non-ohmic plate is substantially aligned with the terminal edge surfaces of the first and second traces.

17. A circuit board in accordance with claim 11 wherein the non-ohmic plate is positioned to capacitatively couple and magnetically couple the first and second traces to each other.

18. A circuit board in accordance with claim 11 further comprising a third trace electrically coupled to a contact of a third differential pair, the third trace being one of an open-ended trace and a contact trace, wherein the non-ohmic plate is positioned to electromagnetically couple the first, second, and third traces to each other and the non-ohmic plate and the traces are configured for a desired electrical performance.

19. A circuit board in accordance with claim 11 wherein the second trace is an open-ended trace.

20. A circuit board in accordance with claim 11 wherein the second trace is a contact trace.

* * * * *